United States Patent [19]

Ngo

[11] Patent Number: 5,105,108

[45] Date of Patent: Apr. 14, 1992

[54] DELAY CIRCUIT WITH PHASE LOCKED LOOP CONTROL

[75] Inventor: Duc Ngo, Chicago, Ill.

[73] Assignee: Zenith Electronics Corporation

[21] Appl. No.: 614,188

[22] Filed: Nov. 14, 1990

[51] Int. Cl.[5] .......................... H03K 5/13; H03K 5/22
[52] U.S. Cl. ................................. 307/603; 307/262; 328/155; 328/55
[58] Field of Search ............... 307/262, 605, 511, 514, 307/516, 601, 603, 606; 328/155, 55

[56] References Cited

U.S. PATENT DOCUMENTS

| | | | |
|---|---|---|---|
| 4,178,631 | 12/1979 | Nelson, Jr. | 328/155 |
| 4,308,619 | 12/1981 | Hughes | 328/155 |
| 4,338,569 | 6/1982 | Petrich | 328/155 |
| 4,355,284 | 10/1982 | Acker | 328/155 |
| 4,546,641 | 10/1985 | Nguyen | 73/32 A |
| 4,795,985 | 1/1989 | Gailbreath, Jr. | 328/155 |
| 4,829,545 | 5/1989 | Guzik et al. | 328/155 |
| 4,922,141 | 5/1990 | Lofgren et al. | 328/155 |

Primary Examiner—Stanley D. Miller
Assistant Examiner—Toan Tran

[57] ABSTRACT

A delay circuit includes an output voltage controllable BICMOS delay element that is coupled to a phase locked loop that develops a control voltage. The control voltage is applied to the output BICMOS delay element and to another BICMOS delay element in the phase locked loop. An input voltage is applied to the phase locked loop and, along with the output of the phase locked loop, to the output BICMOS delay element.

5 Claims, 5 Drawing Sheets

DELAY CIRCUIT WITH PHASE LOCKED LOOP CONTROL

CROSS REFERENCE TO COPENDING APPLICATIONS

This application discloses inventions claimed in copending applications Ser. No. 07/613175, entitled FREQUENCY MULTIPLIER CIRCUIT, Ser. No. 07/613178, entitled VOLTAGE CONTROLLED DELAY ELEMENT and Ser. No. 07/614189entitled SYSTEM FOR MEASURING PULSE WIDTH USING DELAY LINE, in the name of Duc Ngo, all filed on the date of filing of this application and all assigned to Zenith Electronics Corporation.

BACKGROUND OF THE INVENTION

This invention relates generally to delay circuits and specifically to a control circuit for delay elements comprising CMOS (Complementary Metal Oxide Semiconductor) and BICMOS (Bipolar Complementary Metal Oxide Semiconductor) integrated circuit devices. As is well known, similar devices on a common integrated circuit chip exhibits a very high degree of correlation to each other, whereas similar devices on different chips exhibit very poor correlation. For example, it is not uncommon for transistors or other devices on the same IC chip to vary in operating characteristics by less than 1%, whereas similar devices on different chips may vary by 20% or more.

The elements and circuits in the preferred embodiment of the invention utilize BICMOS devices, such as transmission gates and inverters. The current switching ability of these devices is a direct function of applied gate voltage. Within operating limits, the higher the applied gate voltage, the larger the current flow in the device. The invention generally provides a novel and superior delay circuit for integrated circuit use that is especially suitable for high frequency applications where the delays are in the range of a few nanoseconds. The present invention is specifically directed to a delay circuit having a phase locked loop (PLL) voltage controlled delay element. The invention claimed in copending application Ser. No. 613,178 is directed to the voltage controlled delay element and the inventions in applications Ser. Nos. 613,175 and 614,189 are directed to a frequency multiplier circuit and to a pulse width measuring circuit, respectively, that use voltage controlled delay elements.

OBJECTS OF THE INVENTION

A principal object of the invention is to provide a novel delay circuit.

Another object of the invention is to provide a voltage controllable delay circuit that is stable and predictable in use.

A further object of the invention is to provide an improved voltage controllable delay circuit for integrated circuits.

BRIEF DESCRIPTION OF THE DRAWINGS

These and other objects and advantages of the invention will be apparent upon reading the specification in conjunction with the drawings, in which.

DESCRIPTION OF THE PREFERRED EMBODIMENT

Figure 1:
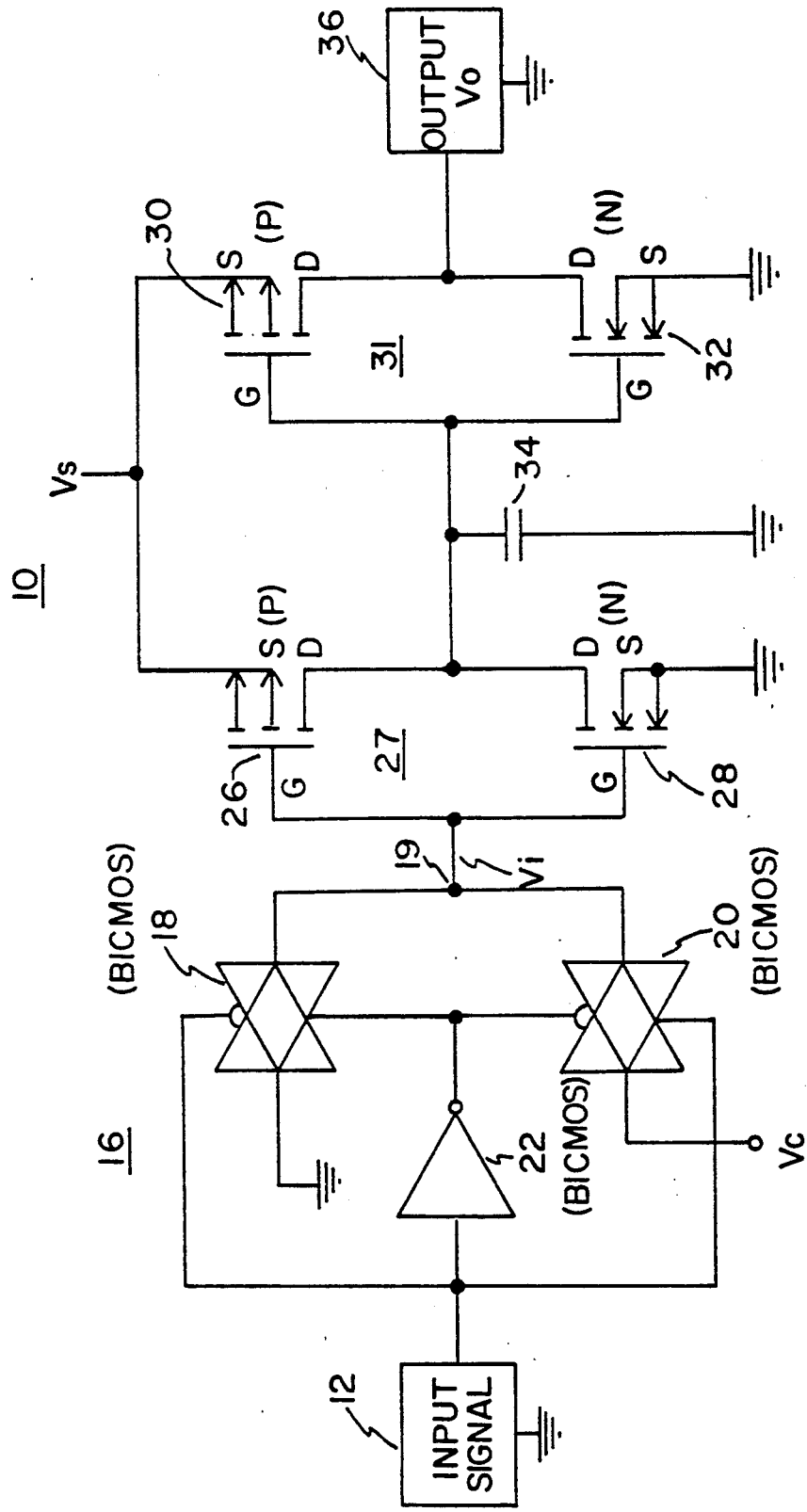
FIG. 1 is a schematic diagram of the basic voltage controllable phase delay element of the invention.

Referring to FIG. 1, a voltage controllable delay circuit is generally indicated by reference character 10. A source of input signal 12 is coupled to a pair of BICMOS transmission gates 18 and 20 and to a BICMOS inverter 22, all included in a transmission gate means 16. The outputs of the transmission gates 18 and 20 are connected together at a junction 19, with the input of transmission gate 18 being connected to ground and the input of transmission gate 20 being connected to a source of DC control voltage (Vc). The delay element of the invention includes a first BICMOS inverter 27 and second BICMOS inverter 31. Inverter 27 comprises complementary connected BICMOS P channel device 26 and N channel device 28. Inverter 31 comprises complementary connected BICMOS P channel device 30 and N channel device 32. A timing capacitor 34 is connected between the two inverters. Each device has a gate terminal "G", a drain terminal "D" and a source terminal "S". The first inverter 27 has its gate terminals connected to the outputs of transmission gates 18 and 20. The second inverter 31 has its gate terminals connected together and to the drain terminals of inverter 27. This connection is also returned to ground through timing capacitor 34. The source terminals of N channel devices 28 and 32 are connected to ground and the source terminals of P channel devices 26 and 30 are connected to a source of operating voltage (Vs). The drain terminals of inverter 31 are connected together and to a block 36 labelled output voltage (Vo). The P and N channel devices are connected in complementary fashion with inverter 27 forming a first switching means and inverter 31 forming a second switching means. It will be noted that the transmission means 16 couples either a reference voltage (ground) or a control voltage Vc to junction 19 under the control of the input pulse signal. Thus the input voltage Vi at junction 19 is either ground or Vc and is in phase with the input pulse signal.

Figure 2:
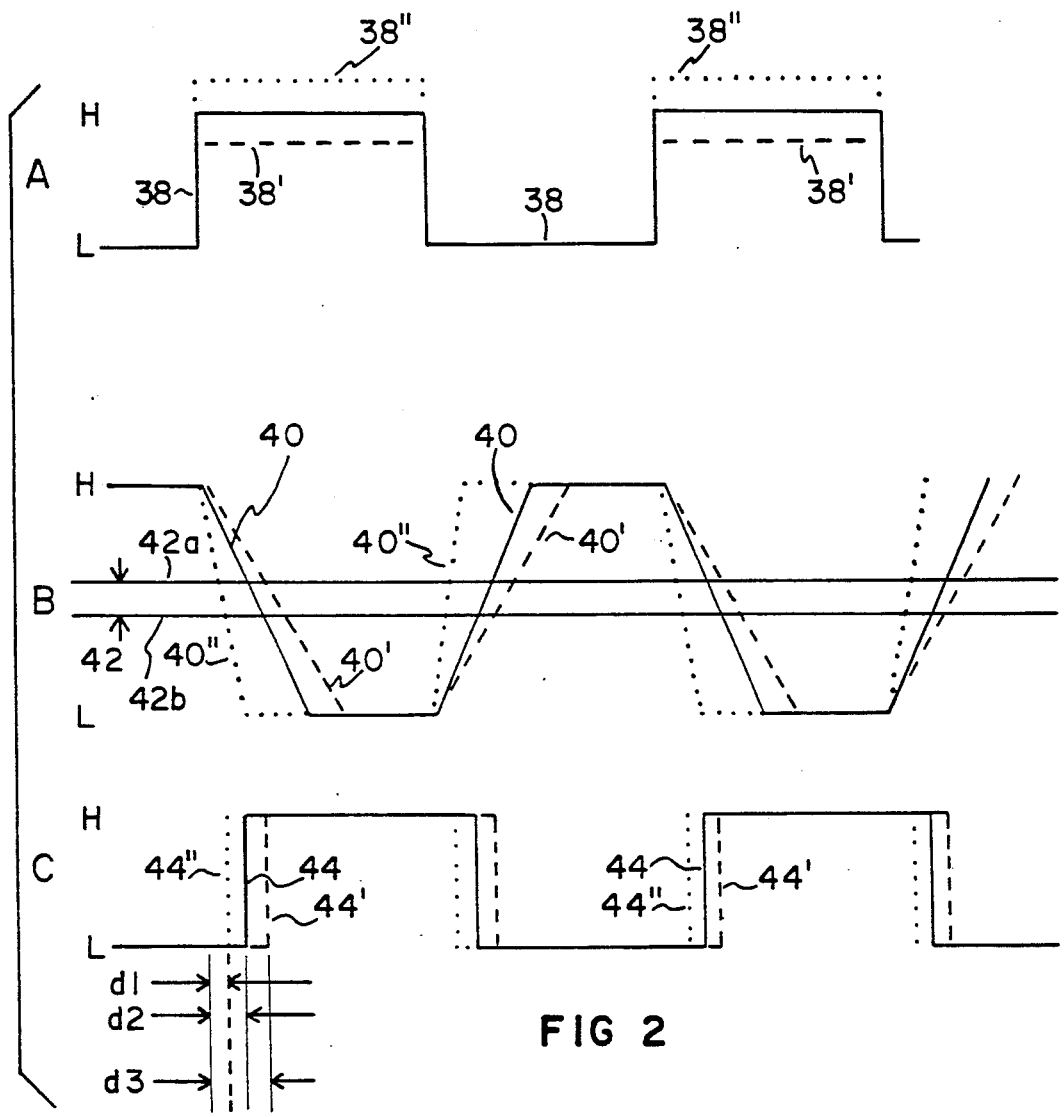
FIG. 2 is a series of waveforms illustrating the operation of the circuit of FIG. 1.

Reference to FIG. 2 is conjunction with FIG. 1 may be helpful. FIG. 2 shows three waveforms in time alignment. Waveform A represents the input voltage Vi (at junction 19). waveform B represents the voltage across timing capacitor 34 and waveform C represents the output voltage Vo. Referring specifically to waveform A, as solid line square wave curve 38, extending between a low level L and a high level H, is shown. An input signal corresponding to curve 38, when applied to the transmission gates 18 and 20 and the inverter 22, results in alternate conduction of the transmission gates 18 and 22 which causes the complementary pair of P and N channel devices 26 and 28 to alternately conduct. Conduction of transmission gate 18 results in a ground reference potential being placed on terminal 19 and conduction of transmission gate 20 results in control voltage Vc being placed on terminal 19. (Ground level corresponds to L and voltage Vc corresponds to H in waveform A.) P channel device 26 is conductive when the input signal is low, (Vi at junction 19 is low) and N channel device 28 is non-conductive. Similarly, when the input signal is high, junction 19 is high, P channel device 26 is driven non-conductive and N channel device 28 is driven conductive. Assuming the input voltage Vi at junction 19 is low, the voltage across timing capacitor 34 is high (P channel device 26 is conductive) and applies voltage Vs to timing capacitor 34. When Vi at junction 19 goes high responsive to the input signal being high, the P channel device 26 and N channel device 28 switch conductivity states and timing capacitor 34 discharges through conductive N channel device 28.

Referring specifically to waveforms B and C, the solid line 40 in waveform B is the discharge voltage (negative slope) across timing capacitor 34 when N channel device 28 conducts responsibe to Vi at junction 19 going high. When Vi goes from high to low, P channel device 26 conducts, N channel device 28 is driven non-conductive and timing capacitor 34 begins to charge (positive slope) along the curve 40.

The P (26 and 30) and N (28 and 32) channel devices switch very rapidly in response to the appropriate voltages on their gate inputs. However, the magnitude of current flow through the channel is a function of the magnitude of the gate potential. The magnitude of current flow affects the charging and discharging rates (time constants) of timing capacitor 34 and provides the delay. The voltage band 42 on waveform B illustrates the potentials at which the gates of the output inverter 31 switch. For example, as curve 40 descends from H to L. it reaches level 42a at which the gates of inverter 31 are driven conductive. Since the inverter switches quickly, as seen in waveform C, the solid line 44 output voltage Vo rises rapidly from low to high. Similarly, during the charge portion of the cycle, when the voltage across timing capacitor 34 is rising from L to H, the inverter 31 switches when level 42b is reached and the output voltage Vo falls. The result in an output voltage Vo waveform that has the same polarity, but is delayed from the input voltage Vi waveform ( and hence the input signal) by a predetermined amount. This amount is indicated as d2 in waveform C.

As mentioned, the current conducting ability of the channel devices is a function of the amplitude of the gate potentioal applied. In waveforms A, B and C, the dashed line curve reference numbers are primed and represent the resultant waveforms with a low gate voltage applied. Dashed line curve 38' in waveform A is therefore of lower amplitude than curve 38, which results in dashed line curve 40' of waveform B having a lesser slope than that of solid line curve 40. Thus the switching point for inverter 31 is delayed. This produces a dashed line curve 44' in waveform C which is delayed by a time d3 from the solid line curve 44. Conversely, for an increase in gate voltage, the double-primed curves are followed with curve 37" in waveform A resulting in a lower slope and a faster voltage change across timing capacitor 34 as illustrated by curves 40" and 44", which produces a shorter signal delay d1. Therefore, changing the gate control voltage Vc varies the amount of delay produced by the delay element 10 of FIG. 1.

Figure 3:
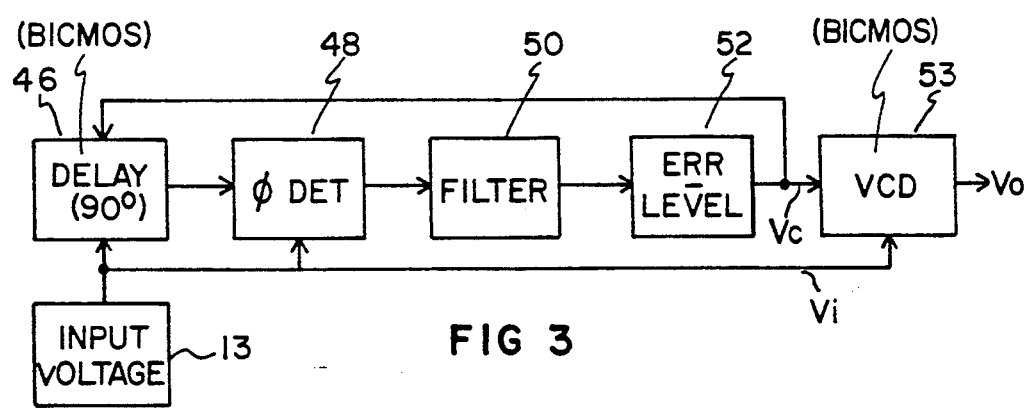
FIG. 3 is a block diagram of a novel voltage controllable delay circuit using a phase locked loop.

In FIG. 3 the novel circuit arrangement of the present invention for precisely controlling a delay element, such as delay element 10, with a PLL is illustrated. An input voltage source 13 couples an input voltage Vi to a 90 degree delay circuit (or element) 46 that in turn supplies a phase detector 48 which is also supplied with the input voltage Vi. A loop filter 50 is coupled to the output of phase detector 48 and supplies an error and level correction circuit 52. The output of circuit 52 is the control voltage Vc which is fed back to delay element 46 and to a voltage controlled delay element 53 which is also supplied with the input voltage Vi. The output of VCD 53 is the output voltage Vo. With the circuit arrangement, the PLL closely controls the amplitude of the control voltage Vc which, as has been shown, is used to very closely control the BICMOS delay element 46.

Figure 4:
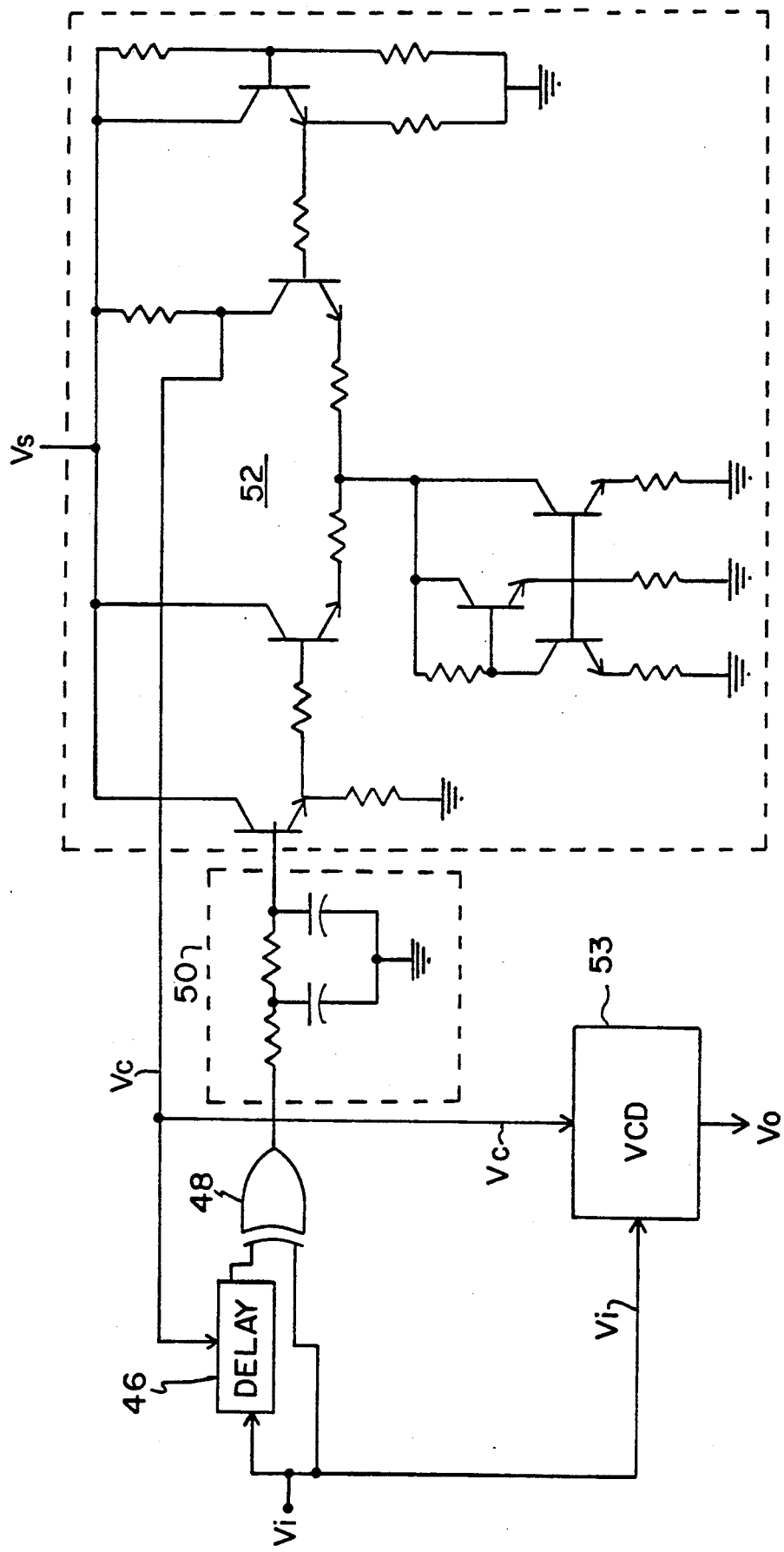
FIG. 4 is a more detailed schematic diagram of the circuit of FIG. 3.

As shown in FIG. 4, the phase detector 48 may be a simple exclusive XOR gate. The delay element 46 ( which may consist of one or more delay elements 10) supplies one input of the XOR gate, with the other being supplied with the input voltage Vi. The loop filter is a simple RC network 50 which supplies an array of transistors 52 that perform amplification functions to develop the error and level shifted potential which constitutes the control voltage Vc. The control voltage Vc is suplied back to the delay element 46 and also to a VCD 53. The nominal time delay of a VCD is calculated from the equation $d = P/N$ where P=1/frequency of input voltage and N in an integer of 1 or more, corresponding to the number of VCDs used to shift the input signal 360 degrees. The 90 degrees phase shift (46) comprises N/4 VCDs. N may also be regarded as the resolution of the system. The larger N is, the smaller the nominal delay required for each VCD. In the preferred embodiment, the error voltage is 4.5 volts and can vary between 4.0 and 5.0 volts to compensate for the shift in the nominal delay due to the tolerance of the BICMOS process. As will be seen, the delay elements are preferably replicated in VCD 53.

Figure 5:
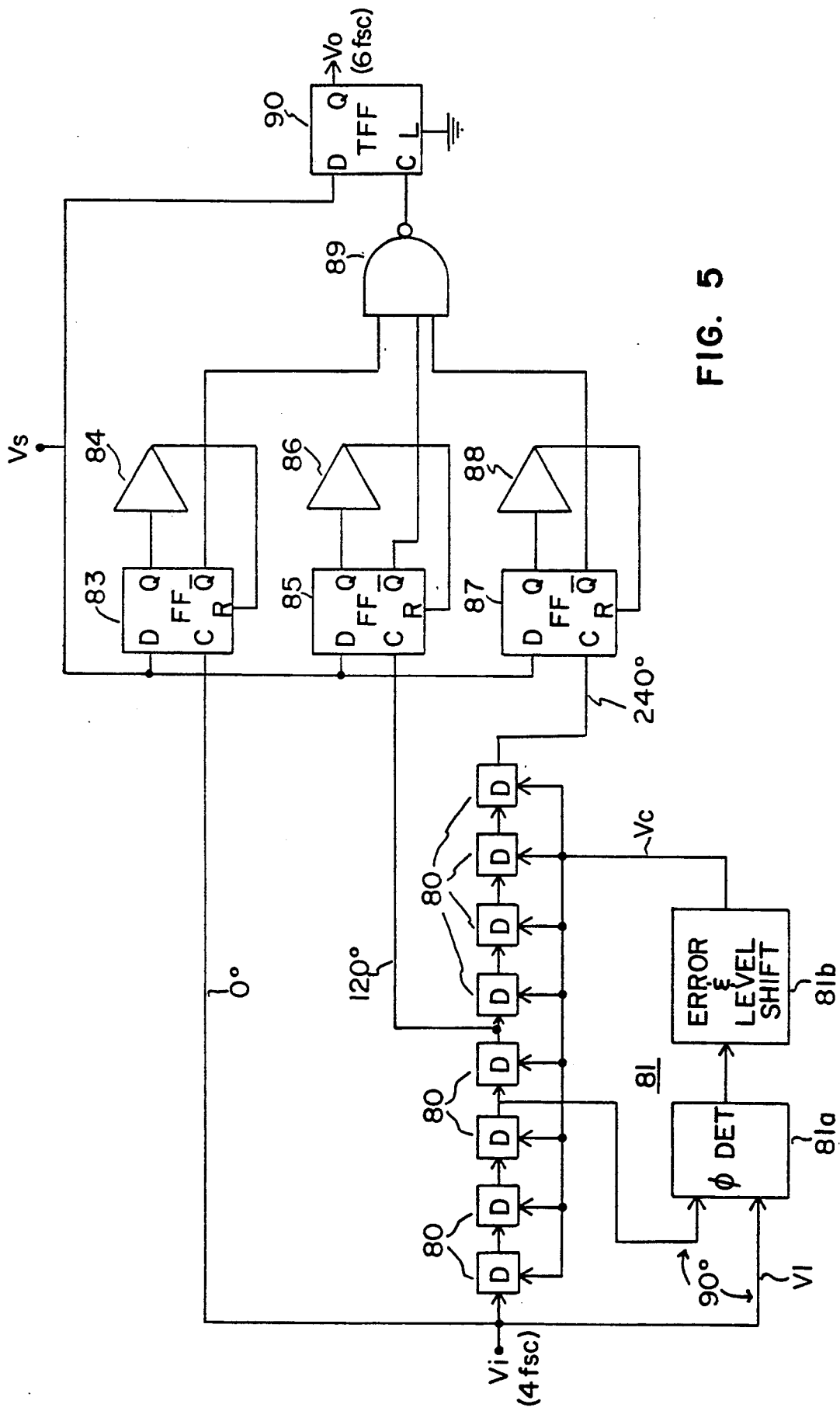
FIG. 5 is a block diagram of a frequency multiplier incorporating a voltage controllable phase delay circuit.

In FIG. 5, a frequency multiplier is shown for developing a 6 Fsc frequency output signal from a 4 Fsc frequency input signal. The 4 Fsc frequency signal corresponds to one that is four times the NTSC color subcarrier frequency of 3.58 MHz (14,31818 MHz) and is commonly used as the sampling frequency in digital television receivers. For many high performance receivers, however, it is desirable to obtain a 6 Fsc sampling frequency (21,47727 MHz ) which entails a high cost because a non-standard crystal is required. A 1.5 multiplier circuit using the invention not only accomplishes the desired result very economically, but does so precisely and realiably. This arrangement is claimed in copending application Ser. No. 613,175 referred to above.

A series connection of identical delay elements 80 has an input voltage Vi, corresponding to a 4 Fsc input signal applied thereto. The Vi input voltage is also applied to a switching arrangement comprising three flip-flops 83, 85 and 87 having corresponding delay resets 84, 86 and 88. The outputs of the flip-flops are coupled to a NAND gate 89 which in turn supplies the C (clock) input of a toggle flip-flop 90 for developing a 6 Fsc output voltage Vo. A PLL 81, including a phase detector 81a and an error and a level shifter 81b, is also supplied with the input voltage Vi and a voltage that is taken from the series of delay elements 80 at a point where the voltage is approximately 90 degrees out-of-phase with input voltage Vi. The output from the error and level shift circuit 81b is the control voltage Vc which is applied to each of the delay elements 80. With the arrangment, the delay created by the first three of delay elements 80 is precisely 90 degrees. Each delay is 5.8 nanoseconds for this application. Each of the indentical delay elements 80 thus produce a 30 degree phase delay for the input voltage Vi of 4 Fsc frequency. A tap after the fourth delay element 80 is connected to the C input of flip-flop 85. This tap corresponds to a delay of 120 degrees since each delay element 80 provides a 30 degree delay. The eighth delay element 80 thus represents a 240 degree phase delay and is coupled to the C input of flip-flop 87.

The flip-flops have their D inputs coupled to supply voltage Vs and their Q outputs coupled to the delays 84, 86 and 88, respectively. The outputs of the delays are connected back to the reset (R) terminals of their respective flip-flops. When flip-flop 83 is turned on in response to the input signal at its C input, its Q output goes low and applies this level to NAND 89. Its $\overline{Q}$ output is high and by virtue of delay 84 applies a reset voltage level to its terminal R to reset or toggle flip-flop 83. The result is a pulse, having a duration determined by the time delay of delay 84, on the Q output of flip-flop 83, which pulse is in response to the rising edge of the input voltage Vi. The C input of flip-flop 85 is clocked 120 degrees later by the rising edge of the Vi input voltage and a similar operation produces a pulse on the $\overline{Q}$ output of flip-flop 85, which is applied to NAND 89. Similarly, 240 degrees later, flip-flop 87 is toggled to produce another output pulse for NAND 89. The result is that the three inputs of NAND 89 have impressed thereon pulses corresponding to the rising edge of the Vi input voltage delayed by 0, 120 and 240 degree intervals. The three $\overline{Q}$ outputs NANDed together produce a sequence of three pulses with 120 degree delay between each pulse. These pulses are applied to toggle flip-flop 90 which will toggle at the rising edges of these pulses. Thus the input voltage Vi of 4 Fsc frequency is converted to an output voltage Vo of 6 Fsc frequency.

Figure 6:
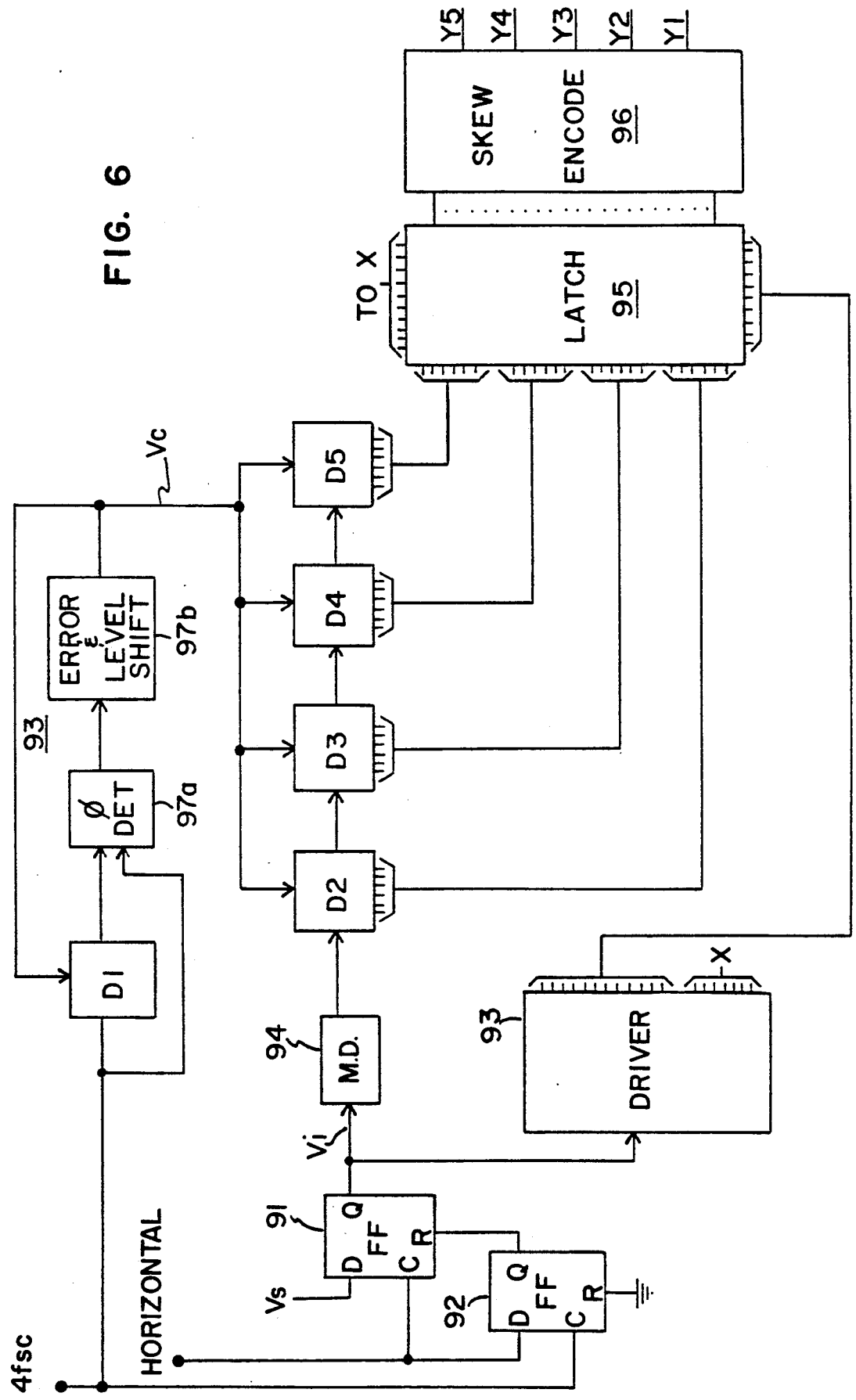
FIG. 6 is a block diagram of a skew generator incorporating a voltage controllable phase delay circuit for measuring pulse width.

In FIG. 6, a pulse width measuring circuit (skew generator) is shown which utilizes the precision delay elements of the invention. This arrangement for determining the width of a pulse is claimed in copending application Ser. No. 614,189, referred to above. In digital television the horizontal frequency is locked to the chroma subcarrier. In non-standard systems, such as those used in some VCR's, for example, the relationship between the horizontal frequency and the chroma subcarrier is not predictable, which causes a phenomenon called skew error. A correction scheme to fix that requires the quantitative number of such skew error. The edge of a horizontal sync pulse is compared with the edge of the 4 Fsc clock signal to develop a pulse, the width of which is indicative of the discrepancy between the two signals. When the two signals are proper and in phase, there is no discrepancy and the pulse width is zero. With the skew generator, the pulse width is quantized by producing a coded output, i.e. a digital number, which is indicative thereof. Since the digital number is a direct measure of the duration of the pulse, it can be used to determine the difference between the two signals.

A pair of flip-flops 91 and 92 are arranged to compare (subtract) the 4 Fsc signal and the horizontal signal. The 4 Fsc signal is also applied to a controllable phase delay circuit that includes a delay D1 and a PLL 97, including a phase detector 97a and an error and level shift circuit 97b, the latter of which produces an output voltage Vc for controlling four identical delays D2, D3, D4 and D5. Each of the delays D1-D5 includes eight individual 2.2 nanoseconds delay elements. The delays have a plurality of discrete outputs, corresponding to the junctions or taps of the individual delay elements. These outputs are generally indicated by the brackets associated with delays D2-D5. The Q output of flip-flop 91 is applied through a matching delay (MD) 94 to the input of delay D2, which in turn is serially coupled to delays D3-D5. Matching delay 94 is required since a relatively high current driver 93 is needed to latch the states of the various delay outputs and the driver 95 entails its own operating delay. Driver 93 provides driving capability for the pulse out of flip-flop 91 to latch the inputs of latch 95 when the pulse goes low. The inputs of latch 95 are the outputs of delays D2-D5. The latched data indicating the pulse width are then converted into a 5-bit number by skew encoder 96. These are indicated as digital outputs Y1-Y5.

In operation, the 4 Fsc input signal is applied to delay D1 and to PLL 97 which produces a precisely controlled control voltage Vc that is used to control the individual delay elements (not shown) in D2-D5. The 4 Fsc signal is subtracted from the horizontal signal resulting in a pulse, the width of which it is desired to quantize or measure, at the Q output of flip-flop 91. When the pulse is negative going, driver 93 activates latch 95 which reads all of the signal inputs from the individual outputs of delays D2-D5. The signal inputs are represented by high/low voltage levels on the individual outputs of the delays. The latched voltage levels are applied to skew encoder 96 where they are quantified as a digital number. As the pulse passes through the individual delay elements in each of the delays D2-D5, the corresponding taps (outputs) between the delay elements change output levels and the output levels are retained in latch 95 at the end of the pulse. Thus, for example, if each delay element in each of delays D2-D5 represents a 2.2 nanoseconds delay, and a 5 nanosecond wide input pulse is applied to the circuit, the leading edge of the pulse will pass only the first two delay element output taps of delay D2. These taps will reflect a change in output level, but no others. When the driver 93 activates latch 95, the only changed output levels are from the first two elements of delay D2 which, when applied to the skew encoder 96 yields a corresponding binary output. Similarly, the leading edge of a very long pulse will pass through all of the individual 2.2 nanoseconds delay elements in delays D2, D3, D4 (and even D5) before the pulse terminates. When driver 93 activates latch 95 upon termination of the pulse, the majority of the latched output levels will indicate a change and the skew encoder will produce a correspondingly much higher binary number.

It is recognized that numerous changes and modifications may be made to the preferred embodiment of the invention by those skilled in the art without departing from its true spirit and scope. The invention is to be limited only as defined in the claims.

What is claimed is:

1. A delay circuit comprising:

first BICMOS delay means including voltage controllable time constant means;

a source of input voltage coupled to said first BICMOS delay means;

phase detector means, including a phase detector, a loop filter and an amplifier and level shifter, for receiving said input voltage and an output of said first BICMOS delay means and for producing a control voltage;

means coupling said control voltage to said first BICMOS delay means for controlling said time constant means; and a second BICMOS delay means coupled to receive said input voltage and said control voltage.

2. The circuit of claim 1 wherein said phase detector comprises an exclusive OR gate.

3. A delay circuit comprising:

first BICMOS delay means including first voltage controllable time constant means;

a source of input voltage coupled to said BICMOS delay means;

phase locked loop means for receiving said input voltage and an output of said first BICMOS delay means and for producing a control voltage, said phase locked loop means, including an exclusive OR gate phase detector, a loop filter and an amplifier and level shifter for developing said control voltage;

a second BICMOS delay means including second voltage controllable time constant means coupled to receive said input voltage and said control voltage; and means coupling said control voltage to said first and to said second BICMOS delay means for controlling said first and said second voltage controllable time constant means.

4. The circuit of claim 3 wherein said first and said second BICMOS delay means each comprises a delay element that includes a pair of BICMOS inverters and a timing capacitor.

5. The circuit of claim 4 wherein each of said BICMOS delay means comprises a plurality of said delay elements.

* * * * *